(12) United States Patent
Lee et al.

(10) Patent No.: US 11,990,182 B2
(45) Date of Patent: May 21, 2024

(54) OPERATION METHODS FOR OVONIC THRESHOLD SELECTOR, MEMORY DEVICE AND MEMORY ARRAY

(71) Applicant: Taiwan Semiconductor Manufacturing Company, Ltd., Hsinchu (TW)

(72) Inventors: Hengyuan Lee, Hsinchu (TW); Cheng-Hsien Wu, Hsinchu (TW); Yu-Sheng Chen, Taoyuan (TW); Elia Ambrosi, Hsinchu (TW); Chien-Min Lee, Hsinchu County (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 221 days.

(21) Appl. No.: 17/577,409

(22) Filed: Jan. 18, 2022

(65) Prior Publication Data

US 2022/0415391 A1   Dec. 29, 2022

Related U.S. Application Data

(60) Provisional application No. 63/214,777, filed on Jun. 24, 2021.

(51) Int. Cl.
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0038* (2013.01); *G11C 13/0061* (2013.01)

(58) Field of Classification Search
CPC . G11C 13/003; G11C 13/0038; G11C 13/004; G11C 13/0028; G11C 13/0061; G11C 29/08; G11C 13/0026; G11C 2213/71; G11C 2213/72
See application file for complete search history.

(56) References Cited

U.S. PATENT DOCUMENTS

| | | | |
|---|---|---|---|
| 8,374,022 B2 * | 2/2013 | Langtry | G11C 13/0004 365/158 |
| 2006/0146600 A1 * | 7/2006 | Johnson | G11C 29/12005 365/163 |
| 2010/0165719 A1 * | 7/2010 | Pellizzer | G11C 13/004 365/210.1 |
| 2010/0284211 A1 * | 11/2010 | Hennessey | G11C 11/5678 365/163 |
| 2011/0141798 A1 * | 6/2011 | Kuo | G11C 11/40 365/163 |
| 2014/0268991 A1 * | 9/2014 | Hu | H10N 70/884 257/2 |

* cited by examiner

*Primary Examiner* — Tuan T Nguyen
(74) *Attorney, Agent, or Firm* — JCIPRNET

(57) ABSTRACT

An operation method for a memory device is provided. The memory device includes a two-terminal selector and a resistance variable storage element coupled to the two-terminal selector. The method includes providing a voltage pulse to the memory device. A voltage applied across the two-terminal selector during a falling part of the voltage pulse falls below a holding voltage of the two-terminal selector. A voltage falling rate of the falling part at which the voltage applied across the two-terminal selector reaches the holding voltage is raised for reducing threshold voltage drift of the two-terminal selector.

20 Claims, 16 Drawing Sheets

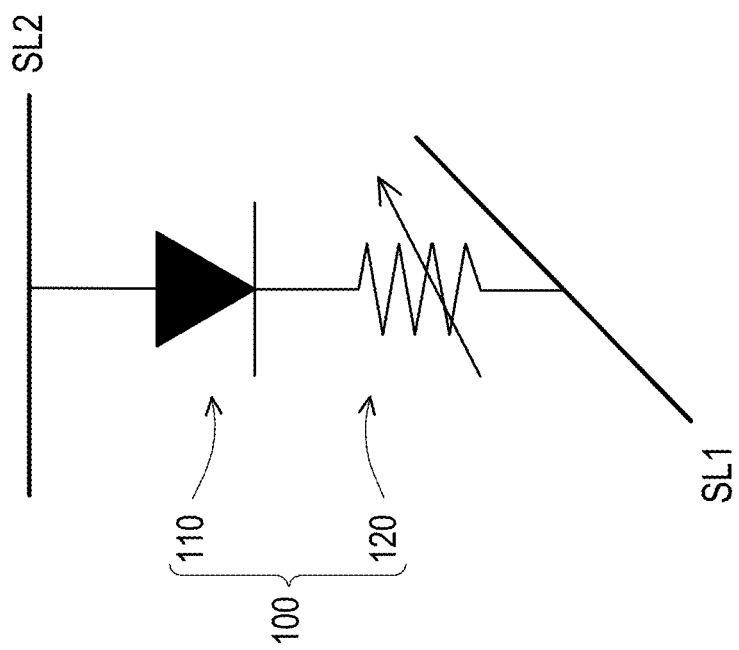

OPERATION METHODS FOR OVONIC THRESHOLD SELECTOR, MEMORY DEVICE AND MEMORY ARRAY

CROSS-REFERENCE TO RELATED APPLICATION

This application claims the priority benefit of U.S. provisional application Ser. No. 63/214,777, filed on Jun. 24, 2021. The entirety of the above-mentioned patent application is hereby incorporated by reference herein and made a part of this specification.

BACKGROUND

With advances in digital technology, there is a greater demand for a nonvolatile memory device with higher capacity, less writing power, higher writing/reading speed, and longer service life. In order to meet the demand, refinement of a flash memory has been progressed. On the other hand, a nonvolatile memory device including memory cells each having a resistance variable element has been researched and developed.

Mostly, each of these nonvolatile memories has field effect transistors (FETs) that connect and disconnect the resistance variable elements from a driving circuit. The FETs have high on/off ratio and prevent leakage current from passing through the unselected memory cells. However, since a FET is a three-terminal device, controlling access of the resistance variable elements by the FETs can significantly limit design flexibility and integration level in creating these nonvolatile memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is an equivalent circuit of a memory cell, according to some embodiments of the present disclosure.

DETAILED DESCRIPTION

Figure 1A:
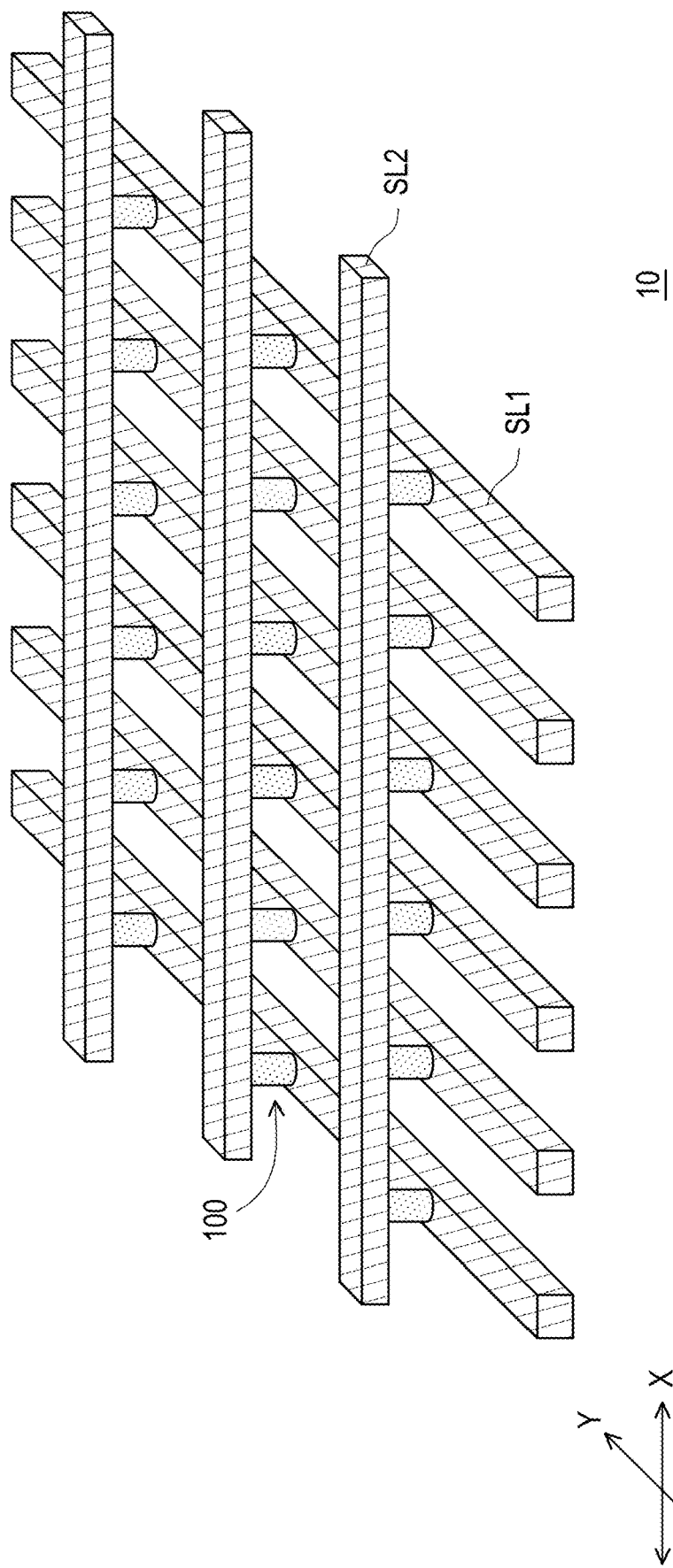
FIG. 1A is a schematic three-dimensional view illustrating a memory array, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic three-dimensional view illustrating a memory array 10, according to some embodiments of the present disclosure.

Referring to FIG. 1A, the memory array 10 includes memory cells 100 arranged along columns and rows. The memory cells 100 in each column are arranged along a direction Y, while the memory cells 100 in each row are arranged along a direction X intersected with the direction Y. The memory cells 100 are defined at intersections of first signal lines SL1 and second signal lines SL2 running over and intersecting with the first signal lines SL1. The first signal lines SL1 may be connected to or functioned as bottom terminals of the memory cells 100, while the second signal lines SL2 may be connected to or functioned as top terminals of the memory cells 100. The first signal lines SL1 may be referred as bit lines, while the second signal lines SL2 may be referred as word lines. Alternatively, the first signal lines SL1 may be referred as word lines, while the second signal lines SL2 may be referred as bit lines. In some embodiments, as shown in FIG. 1A, the first signal lines SL1 extend along the direction Y, while the second signal lines SL2 extend along the direction X. In these embodiments, each first signal line SL1 may connect the bottom terminals of a column of the memory cells 100, or functioned as a common bottom terminal for a column of the memory cells 100. In addition, each second signal line SL2 may connect the top terminals of a row of the memory cells 100, or functioned as a common top terminal for a row of the memory cells 100. However, the extending directions of the first and second signal lines SL1, SL2 may be swapped or altered, as long as the memory cells 100 are formed at intersections of the first and second signal lines SL1, SL2.

Figure 1B:
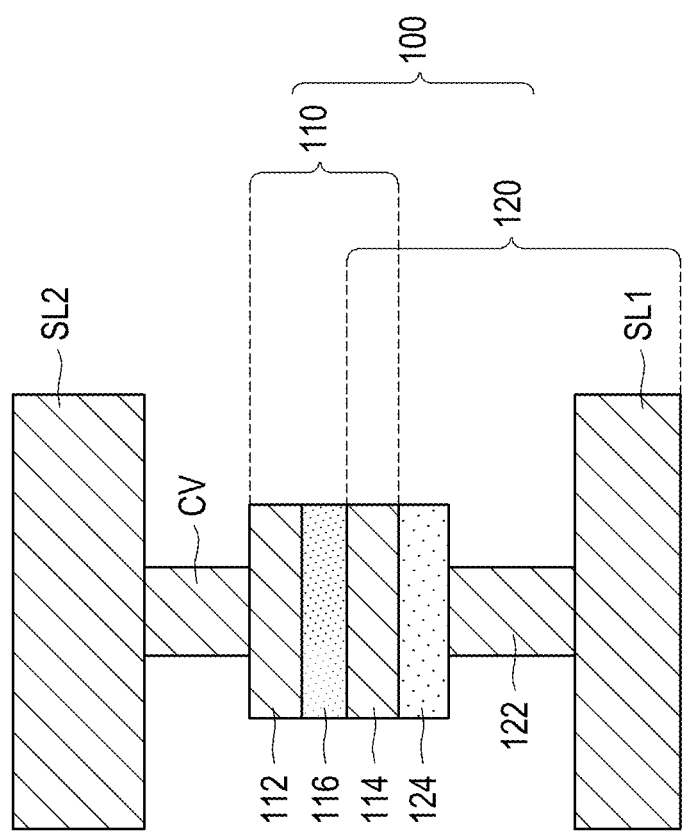
FIG. 1B is a cross-sectional view schematically illustrating a memory cell in a memory array, according to some embodiments of the present disclosure.

FIG. 1B is a cross-sectional view schematically illustrating a memory cell 100 in the memory array 10, according to some embodiments of the present disclosure.

Referring to FIG. 1A and FIG. 1B, each memory cell 100 may include a selector 110 and a resistance variable storage element 120. The selector 110 is a two-terminal switching device, and one of the terminals of the selector 110 is shared with the resistance variable storage element 120. In some embodiments, an electrode 112 is functioned as a top terminal of the selector 110, and may be coupled to the second signal line SL2 through a conductive via CV. In addition, an electrode 114 may be functioned as a bottom terminal of the selector 110, and may be shared with the resistance variable storage element 120. The electrodes 112, 114 are each formed of a conductive material. As examples, candidates of the conductive material may include Cu, W, WN, TiN, TaN, Ru, AlN, Co, carbon doped polysilicon, the like and combinations thereof, and may be doped with carbon.

A switching layer 116 may be sandwiched between the electrodes 112, 114. An electrical resistance across the switching layer 116 may be altered during operation. In some embodiments, the selector 110 is an ovonic threshold selector (OTS). In these embodiments, when a voltage bias applied across the switching layer 116 reaches a threshold voltage, a conductive path may be formed in the switching layer 116, and the switching layer 116 is in the low resistance state. On the other hand, when the voltage bias does not reach the threshold voltage or falls below a holding voltage from above the threshold voltage, the conductive path may not continuously extend through the switching layer 116, and the switching layer 116 is in the high resistance state. As an example, the switching layer 116 may be a chalcogenide compound. Candidates of the chalcogenide compound may contain combinations of elements including Te, Se, As, S, Sb or the like. For instance, the switching layer 116 may include GeTe, GeCTe, AsGeSe, GeSbTe, GeSiAsTe, GeSe, GeSbSe, GeSiAsSe, GeS, GeSbS, GeSiAsS, the like, or combinations thereof.

The resistance variable storage element 120 may be a two-terminal device as well. As described above, the electrode 114 may be functioned as a common terminal of the selector 110 and the resistance variable storage element 120. In some embodiments, an electrode 122 is functioned as the other terminal of the resistance variable storage element 120, and may be coupled to the first signal line SL1. As similar to the electrodes 112, 114, the electrode 122 is formed of a conductive material as well. As examples, candidates of the conductive material may include Cu, W, WN, TiN, TaN, Ru, AlN, Co, carbon doped polysilicon, the like and combinations thereof.

A storage layer 124 lies between the two terminals of the resistance variable storage element 120 (e.g., the electrodes 114, 122). Microstructure in the storage layer 124 may be altered according to input signals applied across the storage layer 124. In corresponding to the microstructure change, the storage layer 124 may be switched between a high resistance state and a low resistance state. Further, the resistance state of the storage layer 124 may be held even when the input signal is removed, and the resistance variable storage element 120 may be referred as a non-volatile memory device. In some embodiments, the resistance variable storage element 120 is a phase change non-volatile memory device. In these embodiments, a crystallinity of the storage layer 124 may be increased when the storage layer 124 is turned to the low resistance state. On the other hand, when the storage layer 124 is in the high resistance state, the storage layer 124 may be amorphous or may have a rather low crystallinity. In some embodiments, the storage layer 124 is formed of a chalcogenide compound. The chalcogenide compound may include Ge, Te and Sb. For instance, the chalcogenide material may be GeSbTe, such as $Ge_2Sb_2Te_5$ (GST225), $Ge_4Sb_2Te_4$ (GST424) or so forth.

The signal for programming the storage layer 124 may be provided through the electrode 122. A thermal energy may be generated by the electrode 122 as a result of joule heating effect, and such thermal energy is provided to the storage layer 124 for changing the microstructure in the storage layer 124. In order to enhance the joule heating efficiency, the electrode 122 may be formed with a rather small diameter. In some embodiments, the electrode 122 has a footprint area smaller than a footprint area of each of the storage layer 124, the electrodes 114, 112 and the switching layer 116. In these embodiments, a sidewall of the electrode 122 may be laterally recessed from sidewalls of the storage layer 124, the electrodes 114, 112 and the switching layer 116. In alternative embodiments, the sidewall of the electrode 122 is substantially coplanar with the sidewalls of the storage layer 124 and the electrodes 114, 112.

FIG. 1C is an equivalent circuit of a memory cell 100, according to some embodiments of the present disclosure.

Referring to FIG. 1B and FIG. 1C, the selector 110 is schematically indicated by a diode in the equivalent circuit, as a diode is also a two-terminal switching device. However, the selector 110 may be bi-directional, and may be actually presented by two diodes connected back to back. In addition, the resistance variable storage element 120 is indicated by a variable resistor in the equivalent circuit, as a variable resistor also has an alterable resistance. As shown in FIG. 1C, the selector 110 and the resistance variable storage element 120 are serially connected between a first signal line SL1 and a second signal line SL2, and share a common terminal. Since the selector 110 and the resistance variable storage element 120 are connected in series, a voltage applied across the memory cell 100 is divided across the selector 110 and the resistance variable storage element 120.

During operation of the memory cell 100, a voltage pulse may be provided to one of the corresponding first and second signal lines SL1, SL2, and the other one of these first and second signal lines SL1, SL2 may receive a reference voltage (e.g., a ground voltage). In order to program the resistance variable storage element 120, the voltage pulse must reach a voltage high enough for ensuring that a voltage across the selector 110 is greater than the threshold voltage of the selector 110, such that the selector 110 can be turned on. Accordingly, the resistance variable storage element 120 is accessible, and can be programmed. On the other hand, in some embodiments, the voltage pulse may be provided with a lower peak voltage during a read operation (avoiding accidentally programming the resistance variable storage element 120, but may still be greater than a threshold voltage of the selector 110), such that the selector 110 can be turned on when a low resistance state is stored in the resistance variable storage element 120, and may be in an off state when a high resistance state is stored in the resistance variable storage element 120. In these embodiments, by detecting whether a conductive path is established through the selector 110 and the resistance variable storage element 120, the resistance state stored in the resistance variable storage element 120 can be identified. In alternative embodiments, the selector 110 is turned on even during a read operation for sensing a high resistance state stored in the resistance variable storage element 120.

Figure 1D:
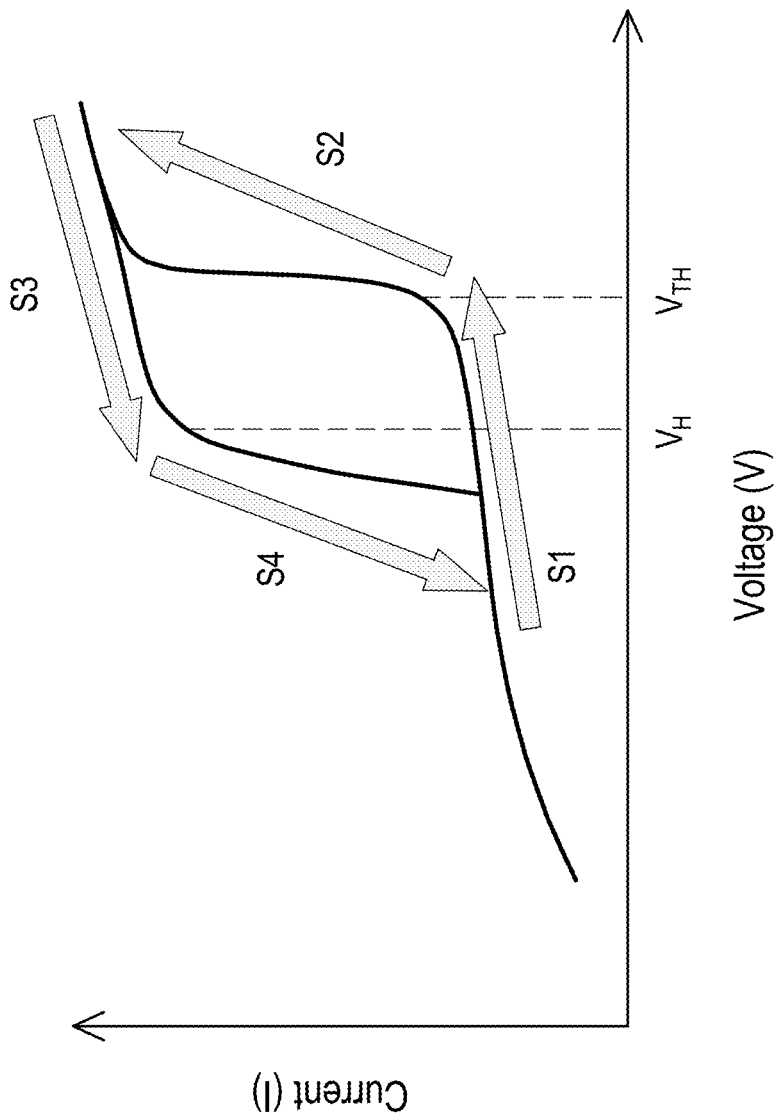
FIG. 1D is a current-voltage (I-V) curve illustrating an operation cycle of a selector in a memory cell, according to some embodiments of the present disclosure.

FIG. 1D is a current-voltage (I-V) curve illustrating an operation cycle of a selector 110, according to some embodiments of the present disclosure.

Referring to FIG. 1D, each operation cycle of the selector 110 may have multiple stages. Along a timeline, a voltage applied across the selector 110 may increase during a first stage S1 and a second stage S2 following the first stage S1, and then decrease during a third stage S3 and a fourth stage S4 following the third phase S3. At the first stage S1, a current passing through the selector 110 is kept low, and the selector 110 is in a high resistance state (i.e., an off state). When the voltage is raised over a threshold voltage $V_{TH}$ of the selector 110, operation of the selector 110 enters the second stage S2. At the second stage S2, the current passing through the selector 110 significantly increases as the voltage across the selector 110 is slightly raised, and the selector 110 is being switched to a low resistance state (i.e., an on state). When the current is saturate, operation of the selector 110 enters the third stage S3, at which the current passing through the selector 110 is kept high, and the selector 110 is in the low resistance state (i.e., the on state). The fourth stage S4 is entered as the voltage across the selector 110 is lowered below a holding voltage $V_H$, and the current passing through the selector 110 decreases dramatically as the voltage applied across the selector 110 is slightly lowered. At the fourth stage S4, the selector 110 is being switched back to the high resistance state (i.e., the off state), and an operation cycle may be completed.

When the selector 110 is turned on at the third stage S3, the resistance variable storage element 120 coupled to the selector 110 can be programmed, or a read current may or may not pass through the resistance variable storage element 120 and the selector 110. On the other hand, the selector 110 returns to the first stage S1 when a programming operation of the resistance variable storage element 120 or detection of the read current is over. In addition, the selector 110 may stay at the first stage S1 while not being selected, or in a condition that the resistance variable storage element 120 at a high resistance state is subjected to a read operation.

As will be further described with reference to FIG. 2, a voltage pulse may be applied at opposite ends of the memory cell 100 for switching the selector 110 as well as programming or reading the resistance variable storage element 120. The selector 110 would be turned on if a voltage across the selector 110 reaches the threshold voltage $V_{TH}$, and returns to an off state when the voltage across the selector 110 is lowered below the holding voltage $V_H$. In certain situation (e.g., the resistance variable storage element 120 at a high resistance state is subjected to a read operation), the voltage applied across the selector 110 does not reach the threshold voltage $V_{TH}$, and the selector 110 may stay at the off state.

Figure 2:
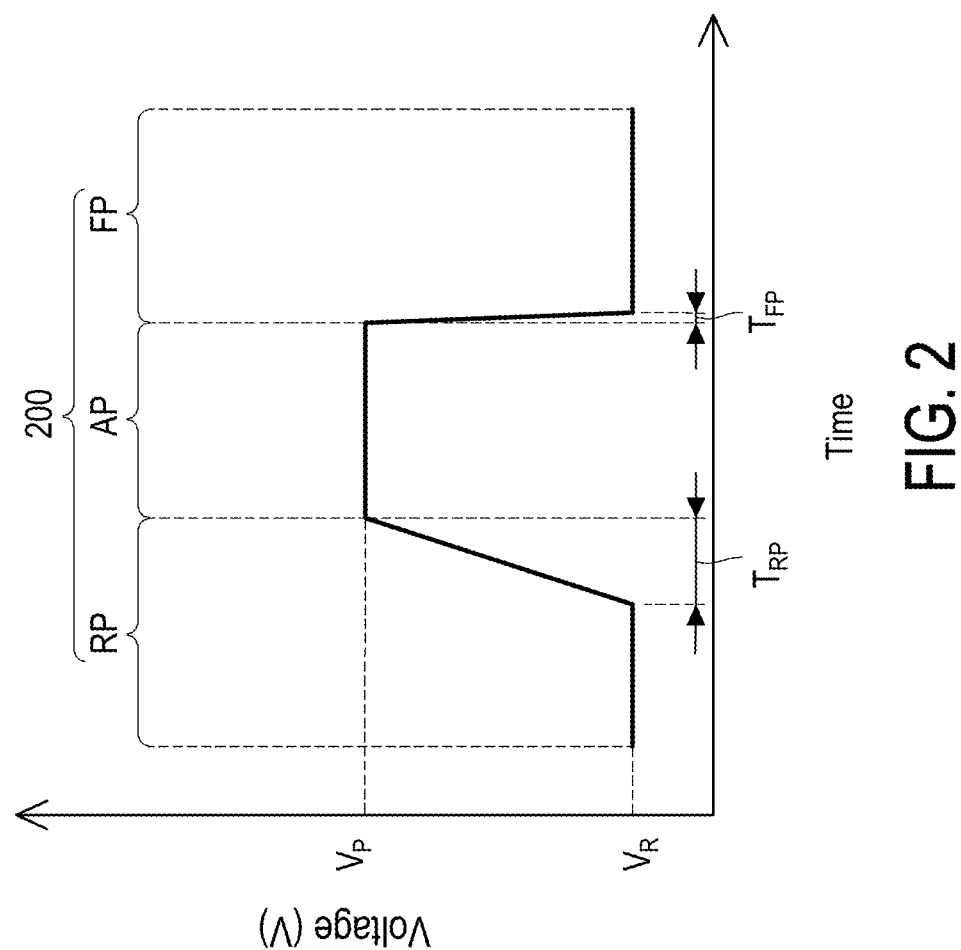
FIG. 2 is a voltage-time diagram schematically illustrating a voltage pulse used for operating a memory cell, according to some embodiments of the present disclosure.

FIG. 2 is a voltage-time diagram schematically illustrating a voltage pulse 200 used for operating a memory cell 100, according to some embodiments of the present disclosure.

Referring to FIG. 2, in some embodiments, the voltage pulse 200 applied to the memory cell 100 has a rising part RP, a falling part FP and an accessing part AP between the rising part RP and the falling part FP. Within the rising part RP, a voltage applied across the memory cell 100 is increased from a reference voltage $V_R$ (e.g., a ground voltage), until a peak voltage $V_P$ is reached. The selector 110 may or may not be turned on during the rising part RP. In some embodiments, the selector 110 is turned on only when the resistance variable storage element 120 is subjected to a write operation or the resistance variable storage element 120 in a low resistance state is subjected to a read operation. In alternative embodiments, the selector 110 is turned on even when the resistance variable storage element 120 in a high resistance state is subjected to a read operation. When the voltage reaches the peak voltage $V_P$, the voltage may be held at the peak voltage $V_P$ within the accessing part AP. If the selector 110 has been turned on, the resistance variable storage element 120 may be programmed, or a read current may pass through the resistance variable storage element 120 and the selector 110 during the accessing part AP. Afterwards, the voltage may fall from the peak voltage $V_P$ within the falling part FP. If the selector 110 is previously turned on, the selector 110 may return to an off state during the falling part FP.

The peak voltage $V_P$ is dependent on the threshold voltage $V_{TH}$ of the selector 110. In certain operation that the selector 110 is supposed to be turned on (e.g., a write operation), the peak voltage $V_P$ should be higher than the threshold voltage $V_{TH}$, such that a voltage across the selector 110, which should be lower than the peak voltage $V_P$, can be ensured to reach the threshold voltage $V_{TH}$. In another operation that switching of the selector 110 may be dependent on the resistance state of the resistance variable storage element 120 (e.g., a read operation), the peak voltage $V_P$ should be lowered (but still greater than the threshold voltage $V_{TH}$), such that the voltage across the selector 110 only reaches the threshold voltage $V_{TH}$ when the resistance variable storage element 120 is in a low resistance state. Moreover, the peak voltage $V_P$ may be further dependent on the operation performed on the resistance variable storage element 120 during the accessing part AP. For instance, a peak voltage $V_P$ of a voltage pulse used in a write operation for programming the resistance variable storage element 120 with a high resistance state is higher than a peak voltage $V_P$ of a voltage pulse used in a write operation for programming the resistance variable storage element 120 with a low resistance state. In addition, a peak voltage $V_P$ of a voltage pulse used for sensing a resistance state of the resistance variable storage element 120 may be lower than the peak voltages $V_P$ of the voltage pulses used for programming the resistance variable storage element 120, in order to prevent from accidentally programming the resistance variable storage element 120 during a read operation.

In the falling part FP, the voltage applied across the memory cell 100 falls from the peak voltage $V_P$, and the selector 110 returns to or keeps at an off state. In order to turn off the selector 110 previously in an on state, the voltage applied across the memory cell 100 should fall sufficiently that a voltage across the selector 110 (which is less than the voltage across the memory cell 100) drops below the holding voltage $V_H$. For instance, the voltage across the memory cell 100 falls back to the reference voltage $V_R$ from the peak voltage $V_P$. A previously established conductive path across the switching layer 116 in the selector 110 should be cut off during the falling part FP. However, an extent of how completely the conductive path is cut off in an operation cycle of the selector 110 may be different from that of another operation cycle of the selector 110. As a consequence, the threshold voltage $V_{TH}$ of the selector 110 may vary from cycle to cycle, and may cause errors in programming and/or reading of the resistance variable storage element 120. In order to reduce such threshold voltage $V_{TH}$ drift, a falling rate of the falling part FP in the voltage pulse 200 is raised. The falling rate is referred to a rate at which the voltage across the memory cell 100 is dropped within the falling part FP of the voltage pulse 200. For instance, the falling rate may be referred to a rate at which the voltage across the memory cell 100 is dropped from the peak voltage $V_P$ to the reference voltage $V_R$ within the falling part FP of the voltage pulse 200. By increasing such falling rate, the extent of how completely the previously established conductive path across the switching layer 116 in the selector 110 can be cut off in each operation cycle of the selector 110 may be significantly increased. Therefore, the difference between the extent of how completely the conductive path is cut off in one operation cycle from that of another operation cycle can be reduced, thus the threshold voltage $V_{TH}$ drift can be effectively limited. In certain embodiments, the threshold voltage $V_{TH}$ drift can be reduced to be less than 0.5 V. In other embodiments, the threshold voltage $V_{TH}$ drift ranges from 0.3V to 0.5V or from 0.3V to 0.7V. In some embodiments, a time interval $T_{FP}$ in which the voltage across the memory cell 100 falls from the peak voltage $V_P$ to the reference voltage $V_R$ within the falling part FP is less than 100 nanoseconds, and greater than 0 second. For instance, the time interval $T_{FP}$ may be less than 10 nanoseconds, and may be equal to or greater than 0.5 nanoseconds. Further, in some embodiments, a falling rate of the voltage applied across the memory cell 100 within the falling part FP is greater than or equal to 100 megavolts/second (MV/S), such as ranging from 100 MV/S to XX 10 gigavolts/second (GV/S).

On the other hand, a rising rate of the rising part RP of the voltage pulse 200 may not affect the threshold voltage $V_{TH}$ drift. As compared to the falling rate, the rising rate is referred to a rate at which the voltage across the memory cell 100 is pulled up within the rising part RP of the voltage pulse 200. For instance, the rising rate may be referred to a rate at which the voltage across the memory cell 100 is raised from the reference voltage $V_R$ to the peak voltage $V_P$ within the rising part RP of the voltage pulse 200. In some embodiments, as shown in FIG. 2, the rising rate of the rising part RP is lower than the falling rate of the falling part FP. In these embodiments, a time interval $T_{RP}$ in which the voltage across the memory cell 100 may rise from the reference voltage $V_R$ to the peak voltage $V_P$ is longer than the time interval $T_{FP}$. In alternative embodiments, the rising rate of the rising part RP may be greater than, substantially equal to or less than the falling rate of the falling part FP. In these alternative embodiments, the time interval $T_{RP}$ may be shorter than, equal to or longer than the time interval $T_{FP}$. In those embodiments where the rising rate of the rising part RP is greater or less than the falling rate of the falling part FP, the voltage pulse 200 may have an asymmetrical shape. On the other hand, in those embodiments where the rising rate of the rising part RP is substantially equal to the falling rate of the falling part FP, the voltage pulse 200 may have a symmetrical shape.

In other embodiments, an accessing part between rising and falling parts of a voltage pulse applied across the memory cell 100 does not hold at a fixed voltage. Instead, such accessing part may have various shapes, according to memory design. In these embodiments, the voltage pulse may or may not be symmetrical even if a rising rate of the rising part is substantially equal to a falling rate of the falling part.

Figure 3A:
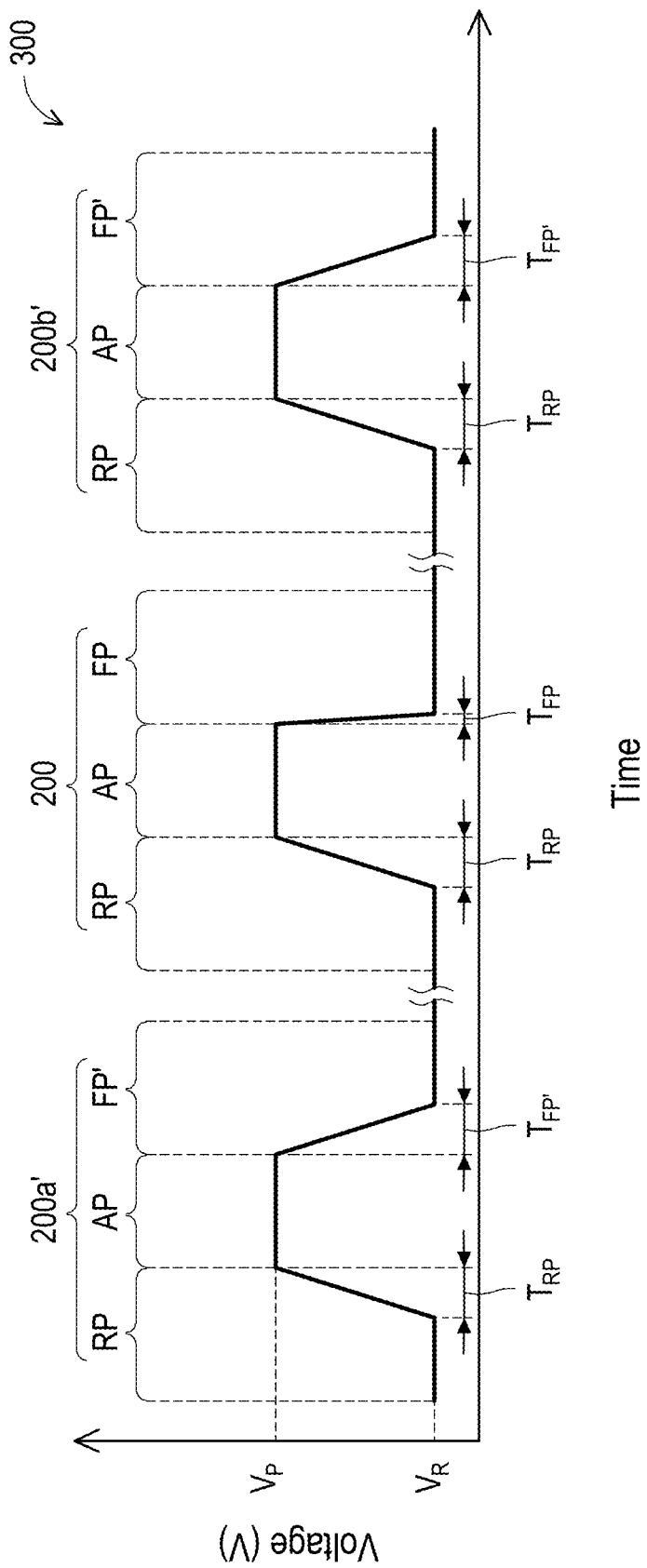
FIG. 3A is a voltage-time diagram schematically illustrating voltage pulses consecutively applied on a test structure in a first testing step.

FIG. 3A is a voltage-time diagram schematically illustrating voltage pulses 200a', 200a, 200b' consecutively applied on a test structure.

Referring to FIG. 3A, a testing cycle including consecutively applying a voltage pulse 200a', the voltage pulse 200 and a voltage pulse 200b' on a test structure is performed multiple times during a first testing step 300. The test structure is structurally similar to the selector 110 of the memory cell 100, and may not include the resistance variable storage element 120 of the memory cell 100. In other words, the test structure includes a switching layer and electrodes at opposite sides of the switching layer. The voltage pulses 200a', 200, 200b' are applied on one of these electrodes, and the other electrode receives a reference voltage. At each testing cycle during the first testing step 300, a threshold voltage exhibited by the test structure in response to each of the voltage pulses 200, 200b' is recorded, and an extent of how completely a conduction path across the switching layer in the test structure can be cut off by a former voltage pulse (i.e., the voltage pulse 200a' or the voltage pulse 200) can be evaluated.

The voltage pulses 200a', 200b' is each similar to the voltage pulse 200 as described with reference to FIG. 2, except that a falling rate of the falling part FP' of each of the voltage pulse 200a', 200b' is less than the falling rate of the falling part FP of the voltage pulse 200. In other words, a time interval $T_{FP'}$ in which the voltage falls from the peak voltage $V_P$ to the reference voltage $V_R$ within the falling part FP' of each of the voltage pulses 200a', 200b' is longer than the time interval $T_{FP}$ in which the voltage drops within the falling part FP of the voltage pulse 200. As an example, the time interval $T_{FP'}$ of each of the voltage pulses 200a', 200b' may be longer than 10 nanoseconds. In addition, a voltage falling rate of the falling part FP' in each of the voltage pulses 200a', 200b' may be less than 100 MV/S.

Figure 3B:
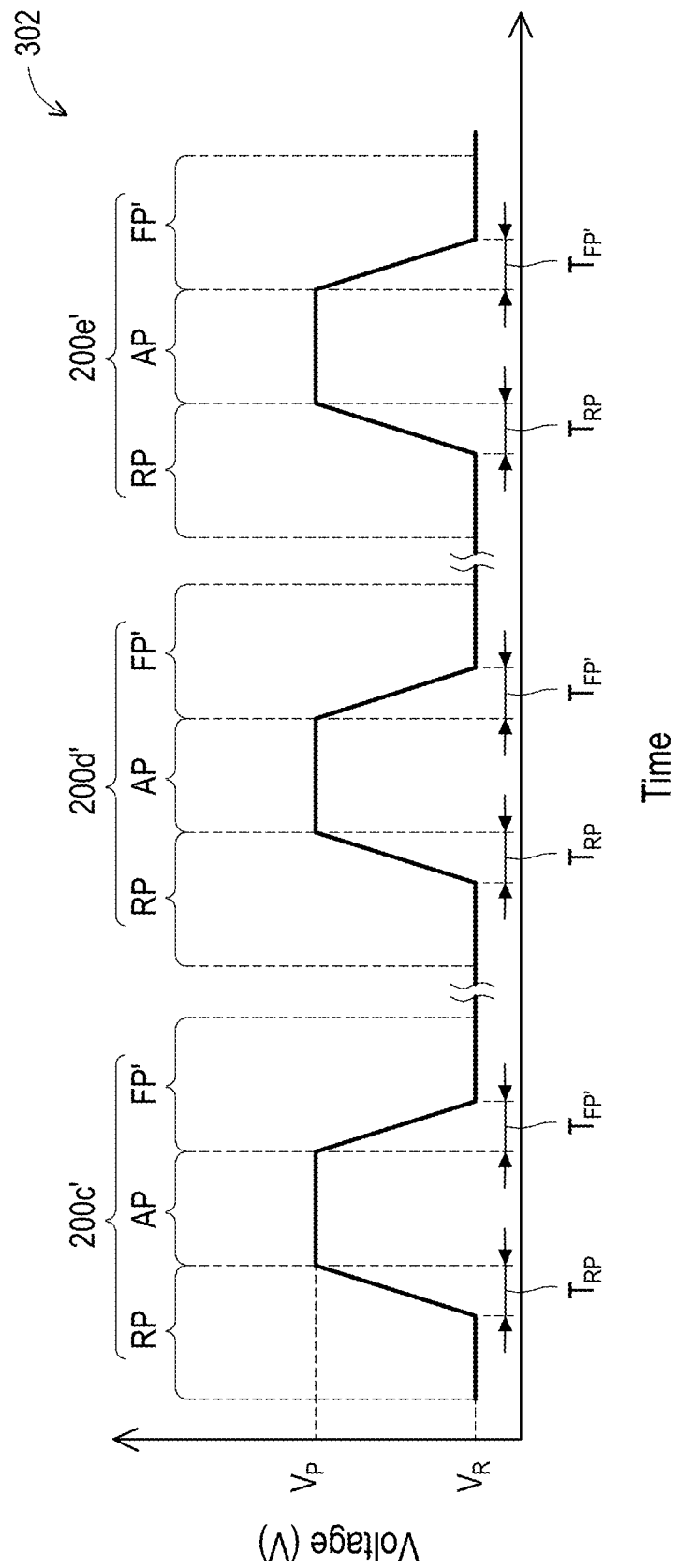
FIG. 3B is a voltage-time diagram schematically illustrating voltage pulses consecutively applied on the test structure in a second testing step.

FIG. 3B is a voltage-time diagram schematically illustrating voltage pulses 200c' 200d', 200e' consecutively applied on the test structure.

Referring to FIG. 3B, a testing cycle including consecutively applying a voltage pulse 200c', a voltage pulse 200d' and a voltage pulse 200e' on the test structure is performed multiple times during the second testing step 302. The voltage pulses 200c', 200d', 200e' in the second testing step 302 are respectively identical with the voltage pulse 200a'/200b' in the testing step 300 as described with reference to FIG. 3A. At each testing cycle during the second testing step 302, a threshold voltage exhibited by the test structure in response to each of the voltage pulses 200d', 200e' is recorded, and an extent of how completely a conduction path across the switching layer in the test structure can be cut off by a former voltage pulse (i.e., the voltage pulse 200c' or the voltage pulse 200d') can be evaluated.

Figure 3C:
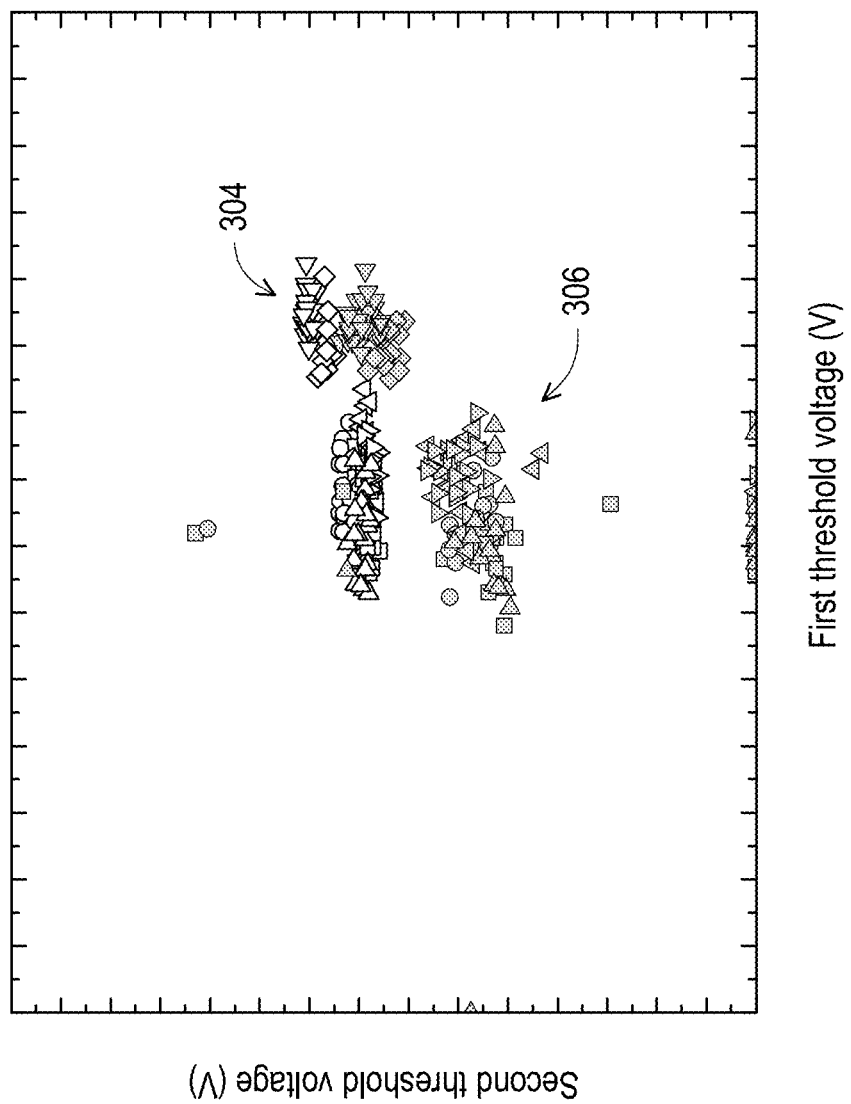
FIG. 3C is a diagram illustrating threshold voltage drift of the test structure during the first and second testing steps.

FIG. 3C is a diagram illustrating threshold voltage drift of the test structure during the first and second testing steps 300, 302.

Referring to FIG. 3C, hollow data points 304 indicate threshold voltages recorded in the first testing step 300, while solid data points 306 indicate threshold voltages recorded in the second testing step 302. A horizontal coordinate of each data point represents a value of the threshold voltage exhibited by the test structure in response to a second voltage pulse in a testing cycle during the first/second testing step 300/302 (i.e., the voltage pulse 200 in the first testing step 300 or the voltage pulse 200d' in the second testing step 302). A vertical coordinate of each data point represents a value of the threshold voltage exhibited by the test structure in response to a third voltage pulse in a testing cycle during the first/second testing step 300/302 (i.e., the voltage pulse 200b' in the first testing step 300 or the voltage pulse 200e' in the second testing step 302). For conciseness, the threshold voltage represented by each horizontal coordinate is referred as a first threshold voltage, and the threshold voltage represented by each vertical coordinate is referred as a second threshold voltage.

The data points 304, 306 both widely spread along a horizontal axis. In other words, the first threshold voltages exhibited by the test structure in response to the voltage pulses 200 of the first testing step 300 and the first threshold voltages exhibited by the test structure in response to the voltage pulses 200d' of the second testing step 302 both vary greatly, despite that the voltage pulses 200 are different from the voltage pulses 200d'. Therefore, such large variation of the first threshold voltages may be caused by inconsistent previous states of the test structure, which are resulted from the voltage pulses 200a' in the first testing step 300 and the voltage pulses 200c' in the second testing step 302. Particularly, the voltage pulses 200a', 200c' with the rather low falling rate may fail to completely and consistently cut off the conductive path established across the switching layer in the test structure, thus threshold voltages required to rebuild the conductive path (i.e., the first threshold voltages) vary greatly.

On the other hand, a distribution of the data points 304 along a vertical axis is much more concentrated than a distribution of the data points 306 along the vertical axis. In other words, a variation of the second threshold voltages exhibited by the test structure in response to the third voltages in the first testing step 300 (i.e., the voltage pulses 200b') is much less than a variation of the threshold voltages exhibited by the test structure in response to the third voltages in the second testing step 302 (i.e., the voltage pulses 200e'). Since the third voltage pulses in the first testing step 300 (i.e., the voltage pulses 200b') are identical with the third voltage pulses in the second testing step 302 (i.e., the voltage pulses 200e'), such difference in variation of the second threshold voltages should be also explained by previous states of the test structure, which are resulted from the voltage pulses 200 in the first testing step 300 and the voltage pulses 200d' in the second testing step 302. As compared to the voltage pulses 200d', the voltage pulses 200 have a higher voltage falling rate (indicated by the short time interval $T_{FP}$). The rather high voltage falling rate of the voltage pulses 200 may ensure that the conductive path established across the switching layer of the test structure can be more completely cut off in every time, thus threshold voltages required to rebuild the conductive path are more consistent.

Although not shown, more experimental results indicate that the higher the voltage falling rate of the voltage pulses, the more consistent threshold voltages are required for the next operation cycles. Therefore, by raising the voltage falling rate of the voltage pulses, the threshold voltage drift can be effectively reduced.

Figure 4A:
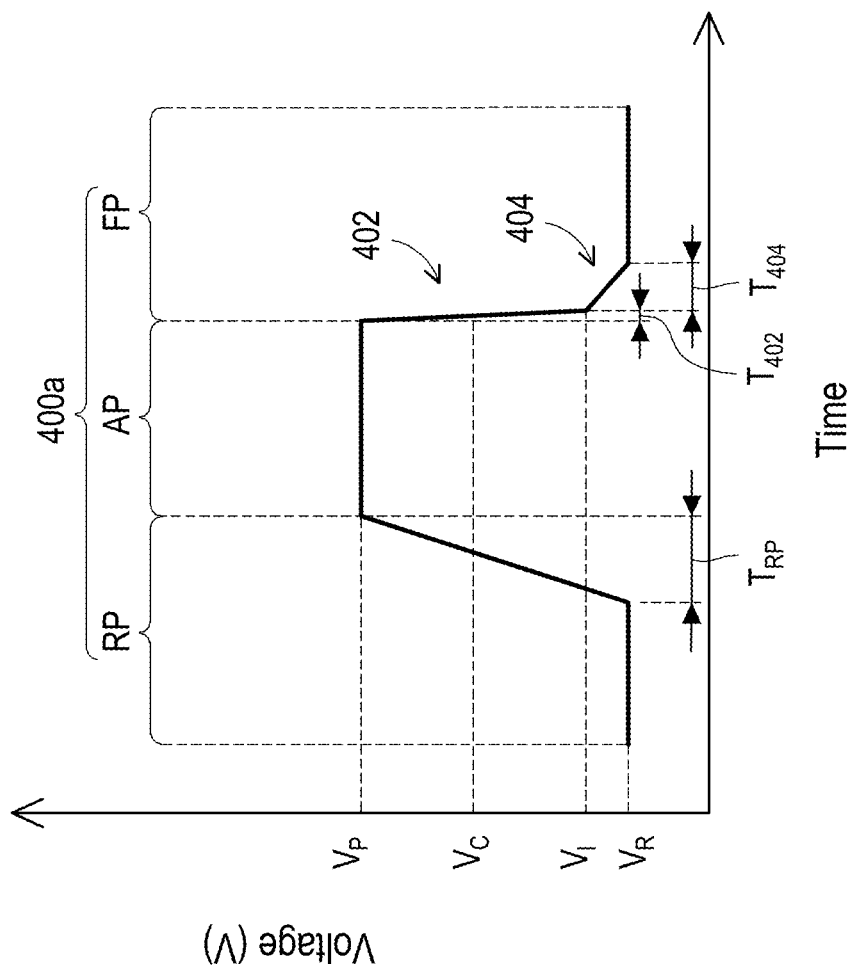
FIG. 4A is a voltage-time diagram schematically illustrating a voltage pulse used for operating a memory cell, according to some embodiments of the present disclosure.

FIG. 4A is a voltage-time diagram schematically illustrating a voltage pulse 400a used for operating a memory cell 100, according to some embodiments of the present disclosure. The voltage pulse 400a is similar to the voltage pulse 200 as shown in FIG. 2. Therefore, only differences between the voltage pulses 200, 400a will be described. The same or the like parts of the voltage pulses 200, 400a would not be repeated again.

Referring to FIG. 4A, the voltage falls within the falling part FP of the voltage pulse 400a by two steps. A voltage applied across the memory cell 100 may fall from the peak voltage $V_P$ to an intermediate voltage $V_I$ in a first step 402, and then further drop to the reference voltage $V_R$ in a second step 404. A voltage applied across the selector 110 should fall below the holding voltage $V_H$ of the selector 110 in the first step 402, in order to turn off the selector 110 in the first step 402. The voltage applied across the memory cell 100 at which the voltage across the selector 110 matches the holding voltage $V_H$ is referred as a critical voltage $V_C$. Since the selector 110 is turned off in the first step 402, the critical voltage $V_C$ lies between the peak voltage $V_P$ and the intermediate voltage $V_I$. In some embodiments, the critical voltage $V_C$ is at least 0.1 V below the peak voltage $V_P$. In addition, the intermediate voltage $V_I$ defining an end point of the first step 402 may be at least 0.1 V greater than the reference voltage $V_R$.

Further, a voltage falling rate in the first step 402 is much higher than a voltage falling rate in the second step 404. As a result, a time interval $T_{402}$ in which the voltage applied across the memory cell 100 drops from the peak voltage $V_P$ to the intermediate voltage $V_I$ may be shorter than a time interval $T_{404}$ in which the voltage falls from the intermediate voltage $V_I$ to the reference voltage $V_R$. In some embodiments, a ratio of the time interval $T_{404}$ with respect to the time interval $T_{402}$ is greater than 1.1. In addition, a voltage falling rate in the first step 402 may range from 100 MV/s to 10 GV/s, while a voltage falling rate in the second step 404 may be less than 100 MV/s. Since the selector 110 is turned off in the first step 402 with much higher voltage falling rate, the conductive path established across the switching layer 116 of the selector 110 can be cut off more completely. As a result, the threshold voltage $V_{TH}$ drift during repeated operations of the selector 110 can be effectively reduced. On the other hand, since the selector 110 has been turned off in the first step 402, the second step 404 does not require high voltage falling rate. Therefore, the second step 404 is allowed to be designed with a rather low voltage falling rate.

Figure 4B:
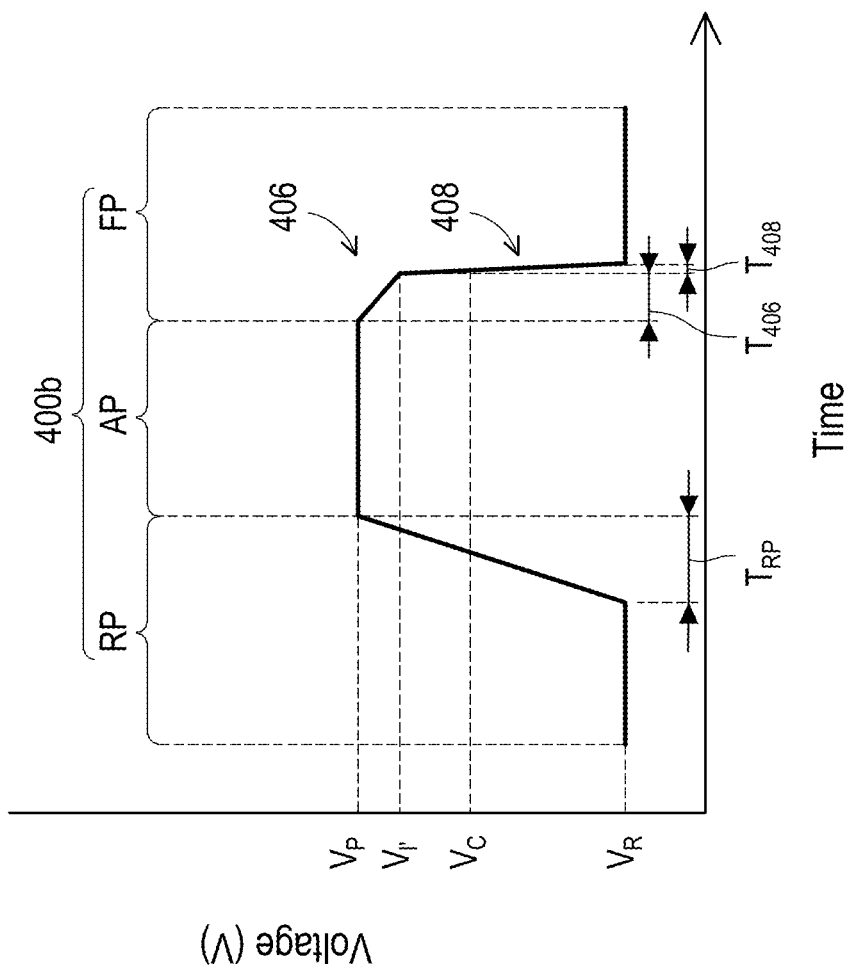
FIG. 4B is a voltage-time diagram schematically illustrating a voltage pulse used for operating a memory cell, according to some embodiments of the present disclosure.

FIG. 4B is a voltage-time diagram schematically illustrating a voltage pulse 400b used for operating a memory cell 100, according to some embodiments of the present disclosure. The voltage pulse 400b is similar to the voltage pulse 400a as shown in FIG. 4A. Therefore, only differences between the voltage pulses 400a, 400b will be described. The same or the like parts of the voltage pulses 400a, 400b would not be repeated again.

Referring to FIG. 4B, an intermediate voltage $V_{I'}$ defining an end point of a first step 406 within the falling part FP of the voltage pulse 400b is greater than the critical voltage $V_C$, such that the selector 110 is turned off in a second step 408 within the falling part FP of the voltage pulse 400b. In some embodiments, the intermediate voltage $V_{I'}$ is at least 0.05 V below the peak voltage $V_P$. In addition, the critical voltage $V_C$ may be at least 0.1 V below the peak voltage $V_P$. Further, a voltage falling rate of the first step 406 is much lower than a voltage falling rate of the second step 408. As a result, a time interval $T_{406}$ in which the voltage applied across the memory cell 100 drops from the peak voltage $V_P$ to the intermediate voltage $V_I$, may be longer than a time interval $T_{408}$ in which the voltage falls from the intermediate voltage $V_I$, to the reference voltage $V_R$. In some embodiments, a ratio of the time interval $T_{406}$ with respect to the time interval $T_{408}$ is greater than 1.1. In addition, a voltage falling rate in the first step 406 may be less than 100 MV/s, while a voltage falling rate in the second step 408 may range from 100 MV/s to 10 GV/s.

Since the selector 110 is turned off in the second step 408 with much higher voltage falling rate, the conductive path established across the switching layer 116 of the selector 110 can be cut off more completely. As a result, the threshold voltage $V_{TH}$ drift during repeated operations of the selector 110 can be effectively reduced. On the other hand, since the selector 110 is turned off in the second step 408, the first step 406 does not require high voltage falling rate. Therefore, the first step 406 can be designed with a rather low voltage falling rate.

Figure 4C:
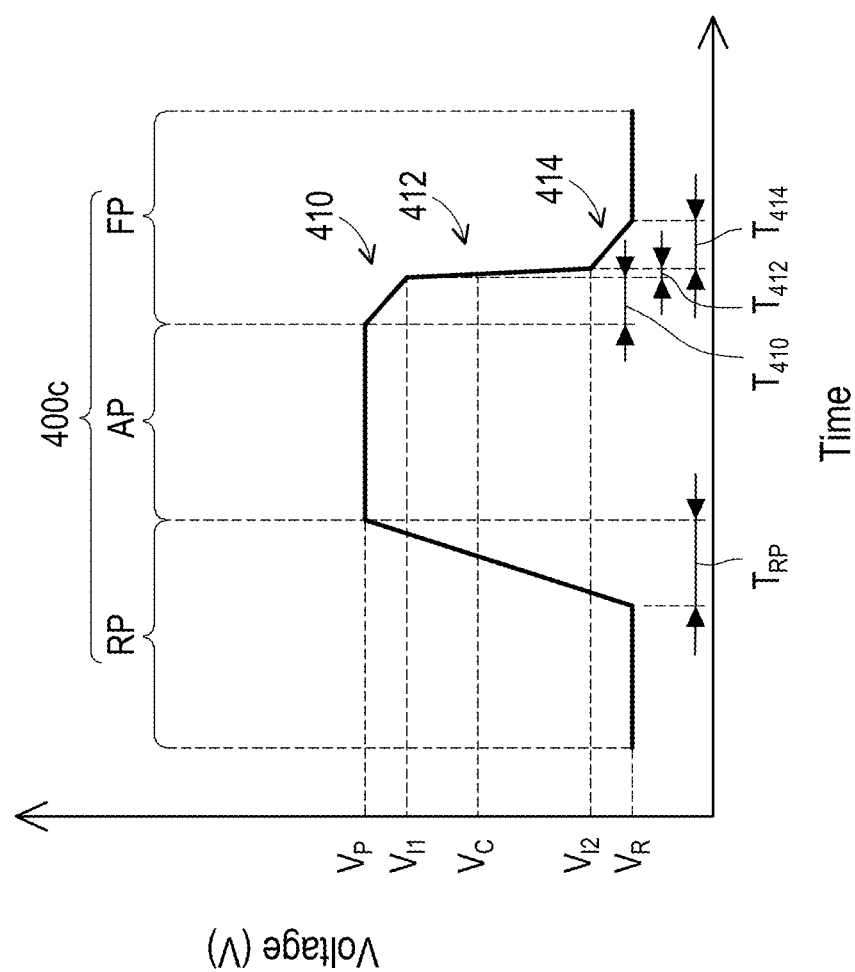
FIG. 4C is a voltage-time diagram schematically illustrating a voltage pulse used for operating a memory cell, according to some embodiments of the present disclosure.

FIG. 4C is a voltage-time diagram schematically illustrating a voltage pulse 400c used for operating a memory cell 100, according to some embodiments of the present disclosure. The voltage pulse 400c is similar to the voltage pulse 400a as shown in FIG. 4A. Therefore, only differences between the voltage pulses 400a, 400c will be described. The same or the like parts of the voltage pulses 400a, 400c would not be repeated again.

Referring to FIG. 4C, a voltage applied across the memory cell 100 falls within the falling part FP of the voltage pulse 400c by three steps. In a first step 410, the voltage may fall from the peak voltage $V_P$ to a first intermediate voltage $V_{I1}$. In a second step 412 following the first step 410, the voltage may drop from the first intermediate voltage $V_{I1}$ to a second intermediate voltage $V_{I2}$. Eventually, the voltage may decline to the reference voltage $V_R$ in a third step 414. The critical voltage $V_C$ is lower than the first intermediate voltage $V_{I1}$, and greater than the second intermediate voltage $V_{I2}$, such that the selector 110 is turned off in the second step 412 within the falling part FP of the voltage pulse 400c. In some embodiments, the first intermediate voltage $V_{I1}$ is at least 0.05V below the peak voltage $V_P$, while the second intermediate voltage $V_{I2}$ is at least 0.1 V greater than the reference voltage $V_R$. In addition, the critical voltage $V_C$ may be at least 0.1 V below the peak voltage $V_P$.

Further, a voltage falling rate of the first step 410 and a voltage falling rate of the third step 414 are respectively much lower than a voltage falling rate of the second step 412. As a result, a time interval $T_{410}$ in which the voltage applied across the memory cell 100 drops from the peak voltage $V_P$ to the first intermediate voltage $V_{I1}$ may be longer than a time interval $T_{412}$ in which the voltage applied across the memory cell 100 falls from the first intermediate voltage $V_{I1}$ to the second intermediate voltage $V_{I2}$. Similarly, a time interval $T_{414}$ in which the voltage applied across the memory cell 100 drops from the second intermediate voltage $V_{I1}$ to the reference voltage $V_R$ may be longer than the time interval $T_{412}$. In some embodiments, a ratio of the time interval $T_{410}$ with respect to the time interval $T_{412}$ and a ratio of the time interval $T_{414}$ with respect to the time interval $T_{412}$ are respectively greater than 1.1. In addition, a voltage falling rate in the first step 410 may be less than 10 MV/s; a voltage falling rate in the second step 412 may range from 100 MV/s to 10 GV/s; and a voltage falling rate in the first step 414 may be less than 100 MV/s.

Since the selector 110 is turned off in the second step 412 with much higher voltage falling rate, the conductive path established across the switching layer 116 of the selector 110 can be cut off more completely. As a result, the threshold voltage $V_{TH}$ drift during repeated operations of the selector 110 can be effectively reduced. On the other hand, since the selector 110 is turned off in the second step 412, the first step 410 and the third step 414 do not require high voltage falling rate. Therefore, the first and third steps 410, 414 can be designed with a rather low voltage falling rate.

Figure 5:
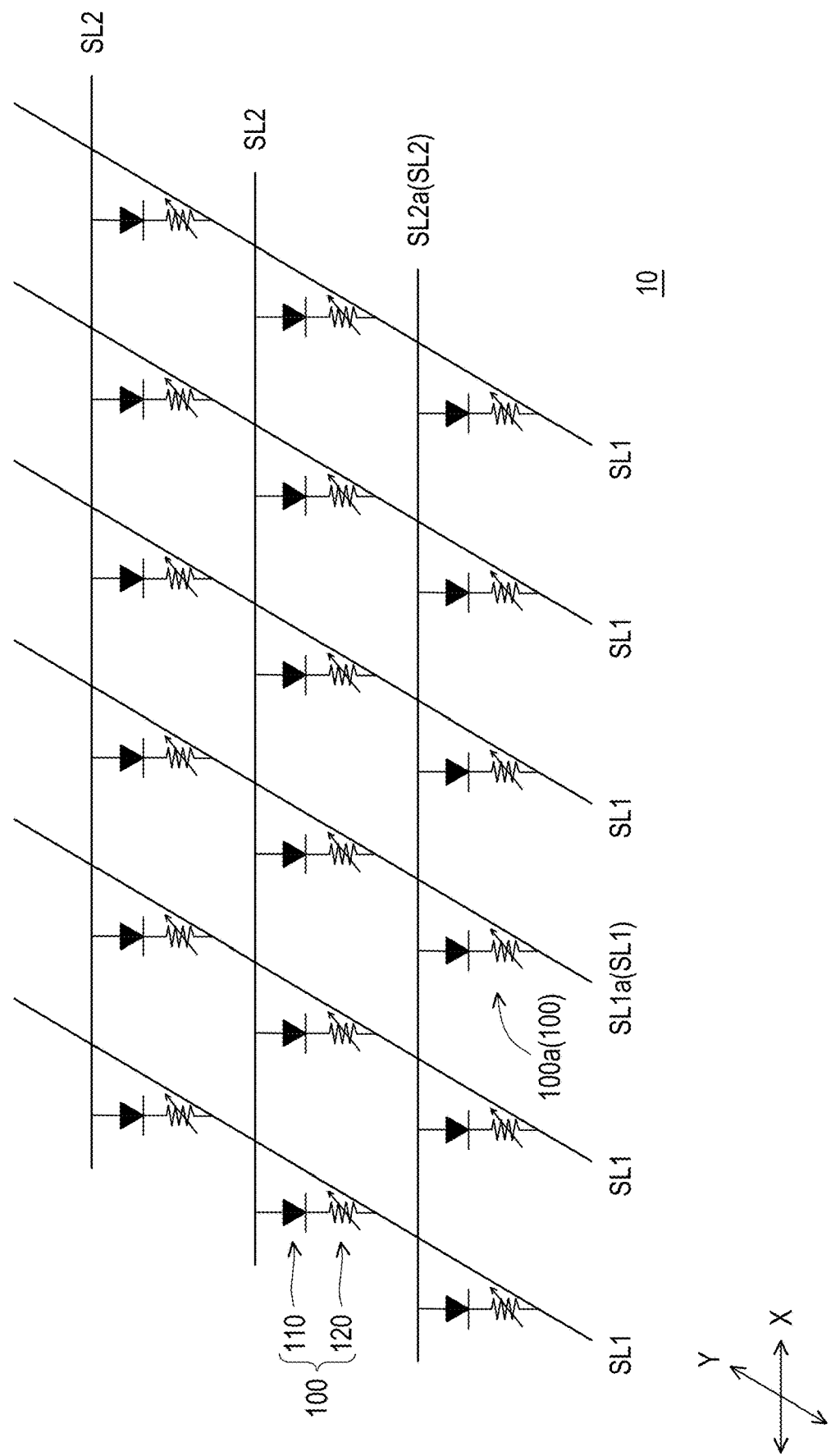
FIG. 5 is a circuit diagram illustrating a cell selection scheme during operation of the memory array as shown in FIG. 1A, according to some embodiments of the present disclosure.

FIG. 5 is a circuit diagram illustrating a cell selection scheme during operation of the memory array 10 as shown in FIG. 1A, according to some embodiments of the present disclosure.

Referring to FIG. 5, in order to access one of the memory cells 100 (referred as a memory cell 100a hereinafter), one of the first signal line SL1 and the second signal line SL2 coupled to the selected memory cell 100a (referred as a first signal line SL1a and a second signal line SL2a) may be coupled to the reference voltage $V_R$ as described with reference to FIG. 2. On the other hand, the other one of the first and second signal lines SL1a, SL2a receives a voltage pulse, such as the voltage pulse 200 as described with reference to FIG. 2, the voltage pulse 400a as described with reference to FIG. 4A, the voltage pulse 400b as described with reference to FIG. 4B or the voltage pulse 400c as described with reference to FIG. 4C. In some embodiments, the first signal line SL1a is coupled to the reference voltage $V_R$, while the second signal line SL2a receives the voltage pulse. In these embodiments, other first signal lines SL1 and other second signal lines SL2 may be coupled to the same pass voltage, in order to prevent unselected and half selected memory cells 100 from being accidentally programmed. As an example, the pass voltage may be about half of the peak voltage $V_P$ of the voltage pulse (as shown in FIG. 2 and FIG. 4A through FIG. 4C). Alternatively, the first signal lines SL1 other than the first signal line SL1a may be coupled to a first pass voltage, while the second signal lines SL2 other than the second signal line SL2a may be coupled to a second pass voltage. For instance, the first pass voltage may be about two third of the peak voltage $V_P$, and the second pass voltage may be about one third of the peak voltage $V_P$.

Figure 6:
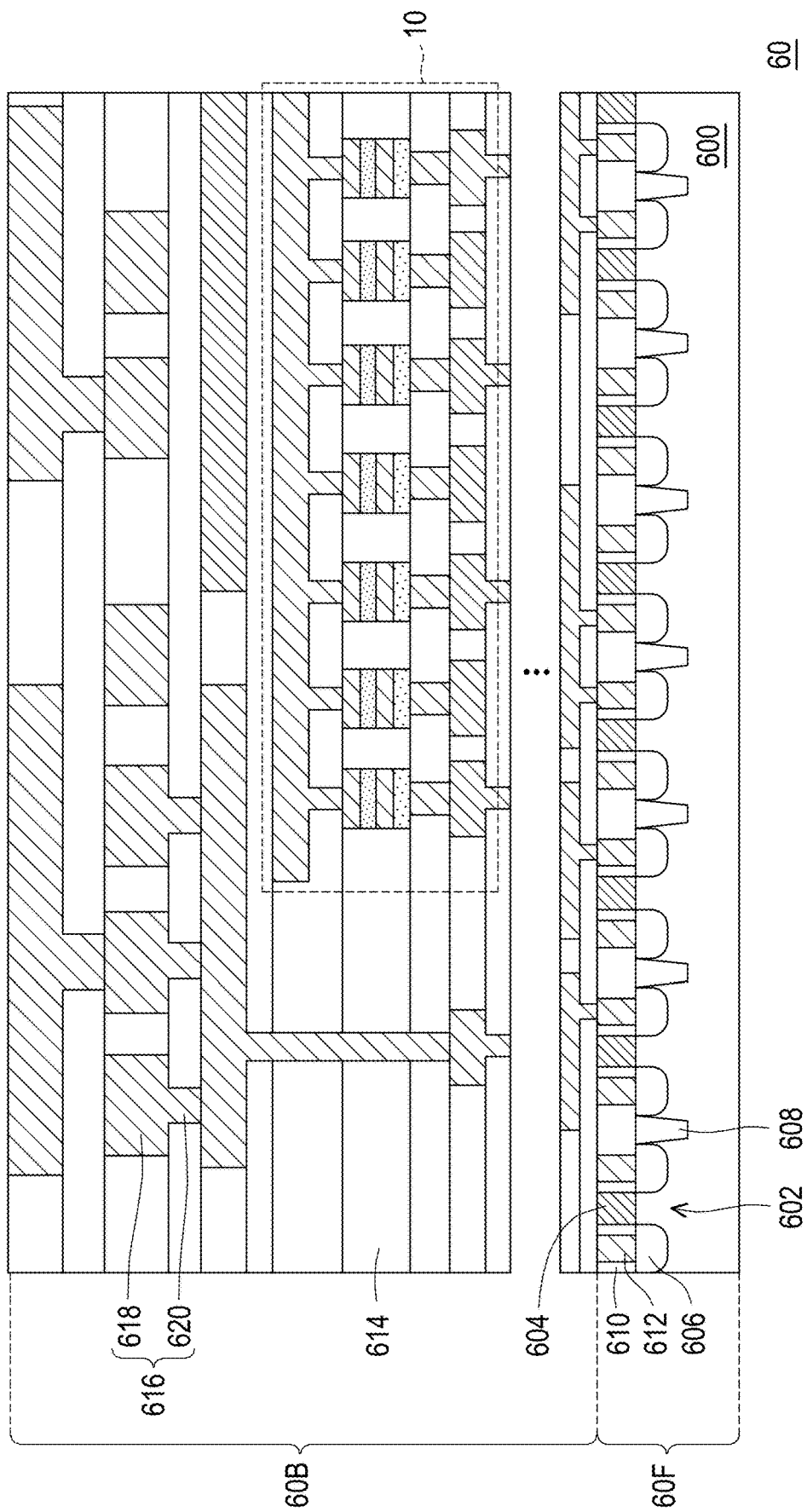
FIG. 6 is a schematic cross-sectional view illustrating a semiconductor chip with the memory array shown in FIG. 1A embedded therein, according to some embodiments of the present disclosure.

FIG. 6 is a schematic cross-sectional view illustrating a semiconductor chip 60 with the memory array 10 (shown in FIG. 1A) embedded therein, according to some embodiments of the present disclosure.

Referring to FIG. 6, the semiconductor chip 60 may have a front-end-of-line (FEOL) structure 60F built on a semiconductor substrate 600. The FEOL structure 60F may include transistors 602. Each of the transistors 602 may include a gate structure 604 and a pair of source/drain structures 606 at opposite sides of the gate structure 604. Further, adjacent transistors 602 may be isolated from one another by an isolation structure 608 formed in the semiconductor substrate 600. In some embodiments, the transistors 602 are planar type transistors. In these embodiments, the gate structures 604 are formed on planar portions of the semiconductor substrate 600, and the source/drain structures 606 may be formed in the semiconductor substrate 600. In alternative embodiments, the transistors 602 are fin type transistors or gate-all-around (GAA) transistors. In these alternative embodiments, the semiconductor substrate 600 may be shaped to form fin structures at its top surface, or stacks of channel structures (e.g., stacks of semiconductor nanosheets) may be formed on the semiconductor substrate 600. Each fin structure/channel structure may extend between a pair of the source/drain structures 606. In addition, the gate structures 604 may intersect and cover the fine structures or the stacks of channel structures. Moreover, the FEOL structure 60F may further include a dielectric layer 610 and contact structures 612 formed in the dielectric layer 610. The contact structures 612 penetrate through the dielectric layer 610, to establish electrical contact with the source/drain structures 606.

The memory array 10 is embedded in a back-end-of-line (BEOL) structure 60B formed on the FEOL structure 60F. The BEOL structure 60B may include a stack of interlayer dielectric layers 614. For conciseness, only one of the interlayer dielectric layers 614 is labeled. The memory array 10 is formed in successive ones of the interlayer dielectric layers 614. Further, the BEOL structure 60B also includes conductive elements 616 spreading in the stack of interlayer dielectric layers 614, for interconnecting the transistors 602, and for out-routing the memory array 10. The conductive elements 616 may be distributed below, around and over the memory array 10, and may include conductive patterns 618 and conductive vias 620. Each conductive pattern 618 laterally extends in one of the interlayer dielectric layers 614. In addition, each conductive via 620 vertically extends through one or more of the interlayer dielectric layers 614 to establish electrical contact with one or more of the conductive patterns 618, or to establish electrical contact with one of the signal lines in the memory array 10 (i.e., one of the first signal lines SL1 or one of the second signal lines SL2). The memory array 10 may be routed to some of the transistors 602 in the FEOL structure 60F through some of the conductive elements 616, and can be driven by a driving circuit including these transistors 602.

Although the conductive elements 616 below the memory array 10 are depicted as being connected to the conductive elements 616 above the memory array 10 through a long conductive via 620 penetrating through multiple interlayer dielectric layers 614, such long conductive via 620 may be alternatively replaced by a combination of short conductive vias 620 and some conductive patterns 618. The present disclosure is not limited to the arrangement of the conductive elements 616. Further, although not shown, passivation layer(s) and electrical connectors as chip inputs/outputs (I/Os) may be formed on the BEOL structure 60B.

Figure 7:
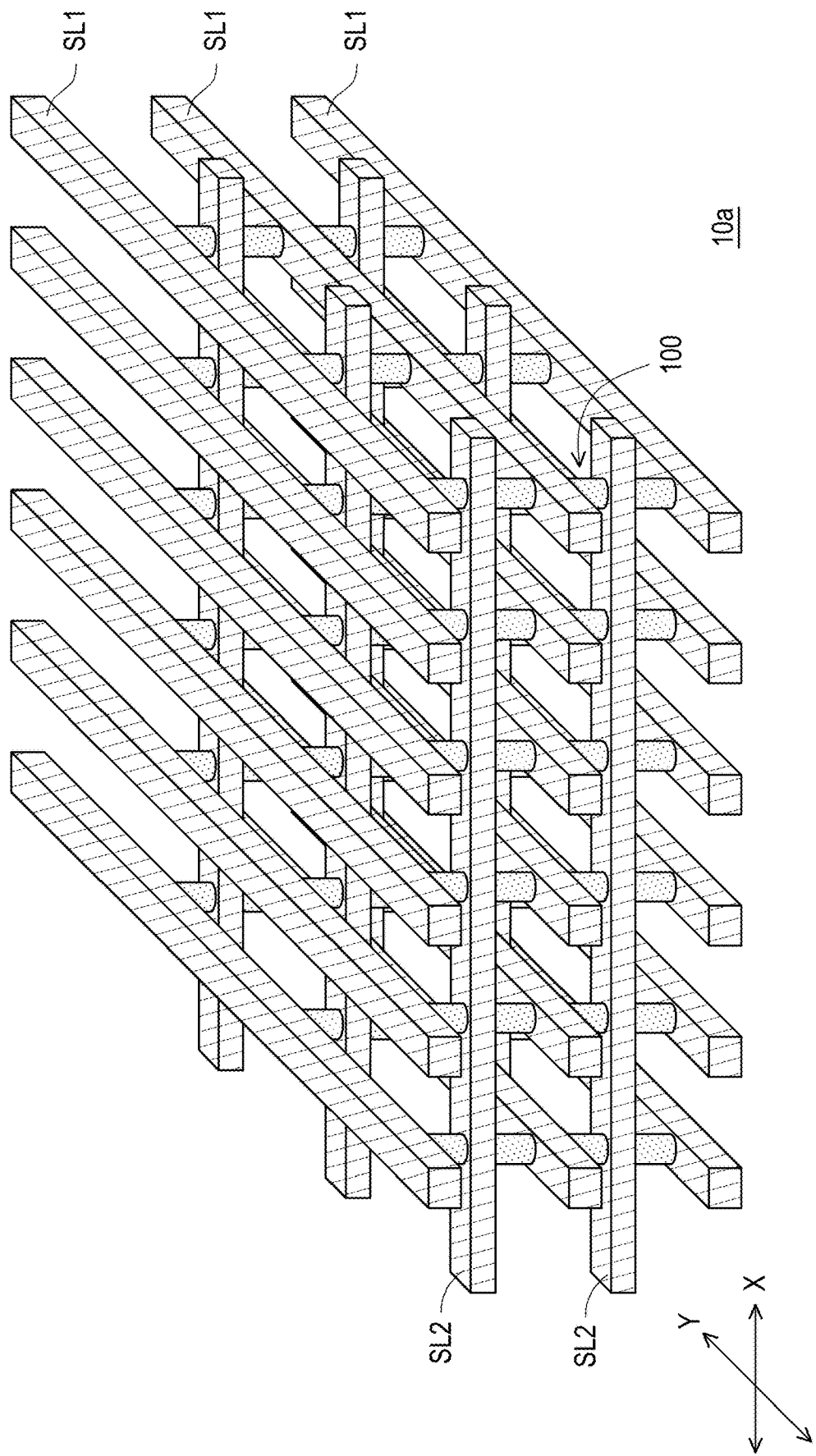
FIG. 7 is a schematic three-dimensional view illustrating a memory array, according to some embodiments of the present disclosure.

FIG. 7 is a schematic three-dimensional view illustrating a memory array 10a, according to some embodiments of the present disclosure.

The memory array 10 as shown in FIG. 1A includes the memory cells 100 arranged at a single horizontal level. On the other hand, the memory array 10a as shown in FIG. 7 has multiple horizontal levels. As shown in FIG. 7, layers of memory cells 100 are stacked along a vertical direction. In addition, each layer of the memory cells 100 are coupled to vertically separated layers of signal lines (i.e., a layer of first signal lines SL1 and a layer of second signal lines SL2). Layers of the first signal lines SL1 and layers of the second signal lines SL2 may be alternatively arranged along a vertical direction. Accordingly, the memory cells 100 in some layers are coupled to underlying first signal lines SL1 and overlying second signal lines SL2, while the memory cells 100 in other layers are coupled to underlying second signal lines SL2 and overlying first signal lines SL1. In addition, vertically adjacent layers of the memory cells 100 may share the layer of signal lines extending in between. For instance, the bottommost layer of the memory cells 100 and the second bottommost layer of the memory cells 100 may share a layer of the second signal lines SL2 in between. As similar to the selection scheme as described with reference to FIG. 5, when a memory cell 100 is selected, the first and second signal lines coupled to the selected memory cell 100 may receive a voltage pulse and a reference voltage. On the other hand, the first signal lines SL1 and the second signal lines SL2 coupled to selected or half-selected memory cells 100 may receive the same pass voltage or different pass voltages.

As being deployed along the vertical direction, the memory array 10a is no longer limited to two-dimensional design, and storage density can be significantly increased without increasing a footprint area of the memory array 10a. Each horizontal level of the memory array 10a may be defined by a layer of the memory cells 100 and the layers of the first and second signal lines SL1, SL2 connected thereto. Although the memory array 10a is depicted as having four horizontal levels, those skilled in the art may adjust an amount of the horizontal levels of the memory array 10a. For instance, the memory cell 10a may have two to ten horizontal levels. Further, as similar to the memory array 10 described with reference to FIG. 6, the memory array 10a shown in FIG. 7 may be embedded in a BEOL structure of a semiconductor chip as well.

Figure 8A:
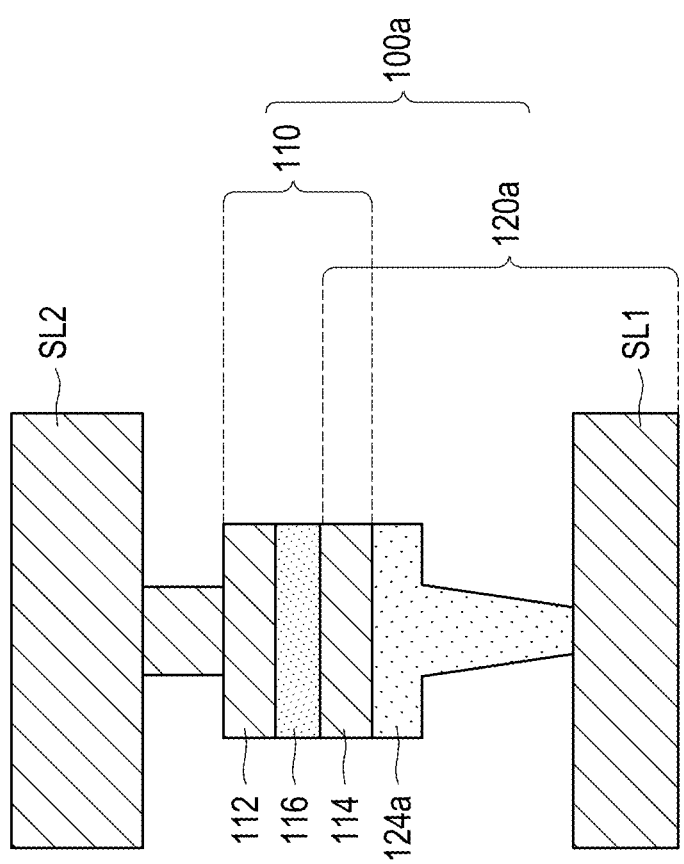
FIG. 8A is a cross-sectional view schematically illustrating a memory cell, according to some embodiments of the present disclosure.

FIG. 8A is a cross-sectional view schematically illustrating a memory cell 100a, according to some embodiments of the present disclosure. The memory cell 100a is similar to the memory cell 100 as described with reference to FIG. 1B. Therefore, only differences between the memory cells 100, 100a will be described. The same or the like parts between the memory cells 100, 100a would not be repeated again.

Referring to FIG. 8A, a resistance variable storage element 120a in a memory cell 100a may use one of the signal lines SL1, SL2 coupled to the memory cell 100a as a bottom terminal, while the electrode 114 may be functioned as a top terminal of the resistance variable storage element 120a, which is shared with the overlying selector 110. In addition, a storage layer 124a lying below the electrode 114 may further extend to the signal line as the bottom terminal of the resistance variable element 120a. For instance, as shown in FIG. 8A, the first signal line SL1 is functioned as the bottom terminal of the resistance variable storage element 120a, while the electrode 114 is functioned as the top terminal of the resistance variable storage element 120a. In addition, the storage layer 124a may have a horizontal portion lying below the electrode 114, and have a vertical portion extending from the horizontal portion to the first signal line SL1. Although not shown, the resistance variable storage element 120a in another memory cell 100a may use a second signal line SL2 as a bottom terminal, and the electrode 114 may be functioned as a top terminal of this memory cell 100a. In addition, the storage layer 124a may extend to the second signal line SL2 along a vertical direction.

As similar to the memory cell 100 as described with reference to FIG. 1B, FIG. 1C, FIG. 2 and FIG. 4A through FIG. 4C, the memory cell 100a can also be operated by the voltage pulse 200 as shown in FIG. 2, the voltage pulse 400a shown in FIG. 4A, the voltage pulse 400b shown in FIG. 4C or the voltage pulse 400c shown in FIG. 4C. Further, as similar to the memory cell 100 as described with reference to FIG. 1A and FIG. 7, a plurality of the memory cells 100a may be arranged as a two-dimensional memory array or a three-dimensional memory array.

Figure 8B:
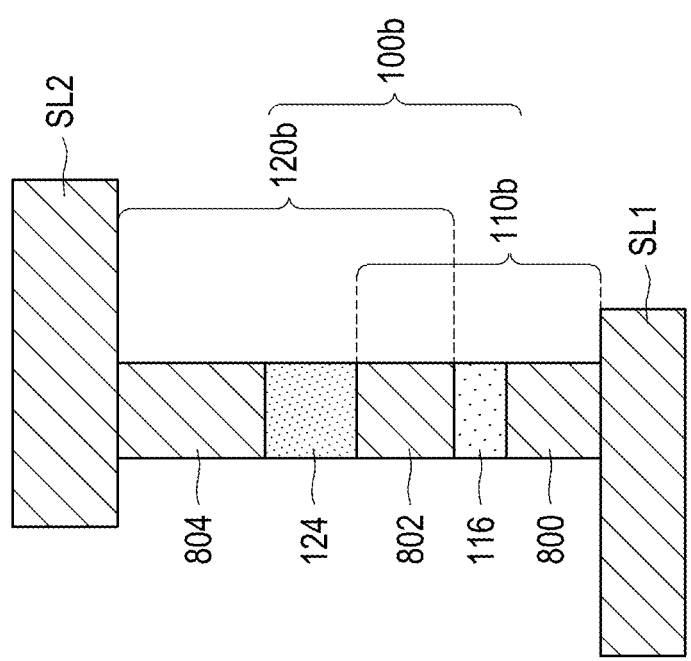
FIG. 8B is a cross-sectional view schematically illustrating a memory cell, according to some embodiments of the present disclosure.

FIG. 8B is a cross-sectional view schematically illustrating a memory cell 100b, according to some embodiments of the present disclosure. The memory cell 100b is similar to the memory cell 100 as described with reference to FIG. 1B. Therefore, only differences between the memory cells 100, 100b will be described. The same or the like parts between the memory cells 100, 100b would not be repeated again.

Referring to FIG. 8B, a resistance variable storage element 120b is stacked on a selector 110b in a memory cell 100b. Electrodes 800, 802 at opposite sides of the switching layer 116 are functioned as bottom and top terminals of the selector 110b, respectively. The electrode 800 lying below the switching layer 116 and functioned as the bottom terminal of the selector 110b may extend to the signal line extending below the memory cell 100b (e.g., a first signal line SL1). On the other hand, the electrode 802 disposed on the switching layer 116 and functioned as the top terminal of the selector 110b may be shared with the resistance variable storage element 120b. In addition to the electrode 802 lying below the storage layer 124 and functioned as a bottom terminal of the resistance variable storage element 120b, the resistance variable storage element 120b may include an electrode 804 located on the storage layer 124 and functioned as its top terminal. The electrode 804 may extend from a top side of the storage layer 124 to the signal line extending on the memory cell 100b (e.g., a second signal line SL2). In some embodiments, the memory cell 100b is formed in a pillar shape. In these embodiments, sidewalls of the electrodes 800, 802, 804, the switching layer 116 and the storage layer 124 may be substantially coplanar with one another. Further, the electrodes 800, 802, 804 may be similar to the electrodes 112, 114, 122 in terms of material candidates.

As similar to the memory cell 100 as described with reference to FIG. 1B, FIG. 1C, FIG. 2 and FIG. 4A through FIG. 4C, the memory cell 100b can also be operated by the voltage pulse 200 as shown in FIG. 2, the voltage pulse 400a shown in FIG. 4A, the voltage pulse 400b shown in FIG. 4C or the voltage pulse 400c shown in FIG. 4C. Further, as similar to the memory cell 100 as described with reference to FIG. 1A and FIG. 7, a plurality of the memory cells 100ba may be arranged as a two-dimensional memory array or a three-dimensional memory array.

As above, access of a memory cell provided in the present disclosure is controlled by a two-terminal selector. As compared to a three-terminal switching device (e.g., a field effect transistor), the two-terminal selector is smaller in size, and is stackable. Therefore, a storage density of a memory array including a plurality of the memory cells can be effectively increased, and the memory array is no longer limited to two-dimensional design. Further, a voltage pulse used for operating the memory cell has a steep falling part, such that a voltage applied across the selector falls quickly. As a result, a conductive path previously established in the selector can be cut off more completely. Therefore, threshold voltage of the selector less vary during repeated operation of the selector. Since the threshold voltage drift of the selector is effectively reduced, errors during read and write operations of the memory array can be reduced as well.

In an aspect of the present disclosure, an operation method of a memory device is provided. The memory device comprises a two-terminal selector and a resistance variable storage element coupled to the two-terminal selector. The operation method comprises: providing a voltage pulse to the memory device in an operation cycle, wherein a voltage applied across the two-terminal selector during a falling part of the voltage pulse falls below a holding voltage of the two-terminal selector, and a critical voltage falling rate of the falling part at which the voltage applied across the two-terminal selector reaches the holding voltage is from 100 MV/S to 10 GV/s; and repeating the operation cycle, wherein a threshold voltage drift of the two-terminal selector during the operation cycles is less than 0.5 V.

In another aspect of the present disclosure, an operation method of an ovonic threshold selector is provided. The operation method comprises: providing a voltage pulse to the ovonic threshold selector in an operation cycle, wherein a voltage applied across the ovonic threshold selector during a rising part of the voltage pulse reaches a threshold voltage of the ovonic threshold selector, the voltage falls below a holding voltage of the ovonic threshold selector during a falling part of the voltage pulse, and a critical voltage falling rate of the falling part at which the voltage is substantially equal to the holding voltage ranges from 100 MV/S to 10 GV/S; and repeating the operation cycle, wherein a threshold voltage drift of the ovonic threshold selector during the operation cycles is less than 0.5 V.

In yet another aspect of the present disclosure, an operation method of a memory array is provided. The memory array comprises: first signal lines; second signal lines intersecting with the first signal lines; and memory cells defined at intersections of the first and second signal lines. The memory cells respectively comprise a selector and a resistance variable storage element coupled to the selector. The operation method comprises an operation cycle, comprising: providing a voltage pulse to one of the second signal lines coupled to a selected one of the memory cells, wherein a voltage applied across the selector of the selected one of the memory cells during a falling part of the voltage pulse falls below a holding voltage of the selector, and a critical voltage falling rate of the falling part at which the voltage applied across the selector reaches the holding voltage is from 100 MV/S to 10 GV/S; providing a reference voltage to one of the first signal lines coupled to the selected one of the memory cells; providing a first pass voltage to rest of the second signal lines; and providing a second pass voltage to rest of the first signal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An operation method of a memory device, wherein the memory device comprises a two-terminal selector and a resistance variable storage element coupled to the two-terminal selector, and the operation method comprises:
   providing a voltage pulse to the memory device in an operation cycle, wherein a voltage applied across the two-terminal selector during a falling part of the voltage pulse falls below a holding voltage of the two-terminal selector, a critical voltage falling rate of the falling part at which the voltage applied across the two-terminal selector reaches the holding voltage is from 100 MV/s to 10 GV/s, and the falling part of the voltage pulse declines by multiple steps; and
   repeating the operation cycle, wherein a threshold voltage drift of the two-terminal selector during the operation cycles is less than 0.5 V.

2. The operation method of the memory device according to claim 1, wherein the two-terminal selector is an ovonic threshold selector.

3. The operation method of the memory device according to claim 2, wherein the two-terminal selector comprises a switching layer formed of a chalcogenide compound, and the chalcogenide compound comprises Te, Se, As, S, Sb or combinations thereof.

4. The operation method of the memory device according to claim 1, wherein the resistance variable storage element is a phase change non-volatile memory.

5. The operation method of the memory device according to claim 1, wherein the two-terminal selector and the resistance variable storage element are formed in a stacking structure.

6. The operation method of the memory device according to claim 1, wherein a section of the falling part with a voltage falling rate holding at the critical voltage falling rate is within 100 nanoseconds.

7. The operation method of the memory device according to claim 6, wherein the section of the falling part is within 10 nanoseconds.

8. The operation method of the memory device according to claim 1, wherein the voltage pulse has an asymmetrical shape.

9. The operation method of the memory device according to claim 1, wherein a voltage rising rate of the rising part is less than the critical voltage falling rate.

10. The operation method of the memory device according to claim 1, wherein the voltage pulse further has an accessing part between the rising part and the falling part, and the resistance variable storage element is accessible during the accessing part.

11. The operation method of the memory device according to claim 1, wherein the memory device is embedded in a back-end-of-line (BEOL) structure of a semiconductor chip.

12. The operation method of the memory device according to claim 1, wherein the selector is turned off during one of the steps of the falling part provided with the critical voltage falling rate.

13. The operation method of the memory device according to claim 1, wherein a first step of the falling part has a first voltage falling rate substantially equal to the critical voltage falling rate, and a second step of the falling part has a second voltage falling rate less than the critical voltage falling rate.

14. The operation method of the memory device according to claim 1, wherein a first step of the falling part has a first voltage falling rate less than the critical voltage falling rate, and a second step of the falling part has a second voltage falling rate substantially equal to the critical voltage falling rate.

15. The operation method of the memory device according to claim 1, wherein a first step of the falling part has a first voltage falling rate less than the critical voltage falling rate, a second step of the falling part has a second voltage falling rate substantially equal to the critical voltage falling rate, and a third step of the falling part has a third voltage falling rate less than the critical voltage falling rate.

16. An operation method of an ovonic threshold selector, comprising:
providing a voltage pulse to the ovonic threshold selector in an operation cycle, wherein a voltage applied across the ovonic threshold selector during a rising part of the voltage pulse reaches a threshold voltage of the ovonic threshold selector, the voltage falls below a holding voltage of the ovonic threshold selector during a falling part of the voltage pulse, a critical voltage falling rate of the falling part at which the voltage is substantially equal to the holding voltage ranges from 100 MV/s to 10 GV/s, and the falling part of the voltage pulse declines by multiple steps; and
repeating the operation cycle, wherein a threshold voltage drift of the ovonic threshold selector during the operation cycles is less than 0.5 V.

17. The operation method of the ovonic threshold selector according to claim 16, wherein the ovonic threshold selector comprises a switching layer formed of a chalcogenide compound.

18. The operation method of the ovonic threshold selector according to claim 16, wherein the rising part is longer than the falling part in terms of lasting time.

19. An operation method of a memory array, wherein the memory array comprises first signal lines; second signal lines intersecting with the first signal lines; and memory cells defined at intersections of the first and second signal lines, the memory cells respectively comprise a selector and a resistance variable storage element coupled to the selector, and the operation method comprises an operation cycle, comprising:
providing a voltage pulse to one of the second signal lines coupled to a selected one of the memory cells, wherein a voltage applied across the selector of the selected one of the memory cells during a falling part of the voltage pulse falls below a holding voltage of the selector, a critical voltage falling rate of the falling part at which the voltage applied across the selector reaches the holding voltage is from 100 MV/s to 10 GV/s, and the falling part of the voltage pulse declines by multiple steps;
providing a reference voltage to one of the first signal lines coupled to the selected one of the memory cells;
providing a first pass voltage to rest of the second signal lines; and
providing a second pass voltage to rest of the first signal lines.

20. The operation method of the memory array according to claim 19, further comprising repeating the operation cycle, wherein a threshold voltage drift of the selector during the operation cycles is less than 0.5 V.

* * * * *